United States Patent
Murasato

[19]

[11] Patent Number: 5,981,976
[45] Date of Patent: Nov. 9, 1999

[54] EPITAXIAL WAFER FOR ALGAINP LIGHT-EMITTING DIODE

[75] Inventor: Shigetaka Murasato, Chichibu, Japan

[73] Assignee: Showa Denko K.K., Tokyo, Japan

[21] Appl. No.: 08/985,199

[22] Filed: Dec. 4, 1997

[30] Foreign Application Priority Data

Dec. 5, 1996 [JP] Japan .................................. 8-325644
Mar. 28, 1997 [JP] Japan .................................. 9-077980

[51] Int. Cl.⁶ .................................................. H01L 33/00
[52] U.S. Cl. ............................................. 257/94; 257/98
[58] Field of Search ........................................ 257/94

[56] References Cited

U.S. PATENT DOCUMENTS

| | | | |
|---|---|---|---|
| 5,008,718 | 4/1991 | Fletcher et al. ............... | 357/17 |
| 5,153,889 | 10/1992 | Sugawara et al. . | |
| 5,466,950 | 11/1995 | Sugawara et al. . | |
| 5,633,514 | 5/1997 | Shirahashi et al. ............ | 257/94 |
| 5,635,733 | 6/1997 | Okagawa et al. ............. | 257/94 |
| 5,656,829 | 8/1997 | Sakaguchi et al. ........... | 257/94 |

FOREIGN PATENT DOCUMENTS 702 414A2  3/1996  European Pat. Off. .
4-212479   8/1992  Japan .
6-103759  12/1994  Japan .

OTHER PUBLICATIONS

1991 American Institute of Physics; Appl. Phys Lett. 58 (10), pp. 1010–1012, Mar. 11, 1995.
Advanced Electronics I–1 semiconductor compound (excerpt), 1994. (See p. 7 of the specification).

*Primary Examiner*—Olik Chaudhuri
*Assistant Examiner*—Douglas A. Wille
*Attorney, Agent, or Firm*—Armstrong, Westerman, Hattori, Mcleland & Naughton

[57] ABSTRACT

An epitaxial wafer for an AlGaInP light-emitting device includes a p-type GaAs substrate, a reflection layer in the form of a laminated body of multiple semiconductor layers provided over the substrate, a double hetero-junction light-emitting structure of AlGaInP formed over the reflection layer, the light-emitting structure including an active layer between upper and lower cladding layers, and a current diffusion layer of AlGaAs provided over the double hetero-junction light-emitting structure. The current diffusion layer is transparent to light emitted by the light-emitting structure. The current diffusion layer is n-type AlGaAs, and has a carrier concentration of from $10^{17}$ cm$^{-3}$ to $2 \times 10^{19}$ cm$^{-3}$, and a thickness that is not more than 1 μm.

16 Claims, 3 Drawing Sheets

EPITAXIAL WAFER FOR ALGAINP LIGHT-EMITTING DIODE

BACKGROUND OF THE INVENTION

1. Field of the Invention

The present invention relates to a high-brightness compound semiconductor light-emitting device, and more particularly to an epitaxial wafer for a light-emitting diode having a double hetero-structure with an AlGaInP active layer, and to a light-emitting diode that uses the epitaxial wafer.

2. Description of the Prior Art

Light-emitting diodes (LEDs) utilizing epitaxially grown layers formed on a compound semiconductor substrate are featured by low power consumption, long life, high emission efficiency and high reliability, and are widely used as a light source in various display devices. AlGaInP is a direct-transition type semiconductor crystal having the highest bandgap energy among group III–V mixed crystals excluding nitrogen compounds. Because LEDs using AlGaInP can emit light at a shorter wavelength than conventional AlGaAs-based LEDs fabricated by the liquid-phase epitaxy (LPE) method, increasingly it is being used for high-brightness light-emitting element applications. In particular, interest has recently focussed on LEDs that have a GaAs substrate and a double hetero-structure (DH) with an AlGaInP active layer that is lattice-matched with the substrate, since such LEDs are able to emit light at high brightness from green to red. Moreover, owing to the fact that such AlGaInP mixed crystal LEDs have less Al in their composition, they are also regarded as having superior humidity resistance compared to AlGaAs-based LEDs fabricated by the LPE method.

A drawback of AlGaInP-based LEDs is that since they have a thin-film structure formed by the metal-organic chemical vapor deposition (MOCVD) method, current injected from the electrodes is not readily diffused. Hence, emission efficiency is not always sufficient, especially in the short wavelength regions. This has led to various attempts at structural improvements. In one example, JP-B-6-103759 discloses an LED structure provided with a current diffusion layer that is a thick layer of AlGaAs. As illustrated by FIG. 1, this LED comprises an n-type GaAs substrate 1, an n-type AlGaInP lower cladding layer 2 having a thickness of 1 $\mu$m, an AlGaInP active layer 3 having a thickness of 0.5 $\mu$m, a p-type AlGaInP upper cladding layer 4 having a thickness of 0.2 $\mu$m, a p-type AlGaAs current diffusion layer 5 having a thickness of 3 $\mu$m, a p-electrode 6 and an n-electrode 7.

A condition required of the current diffusion layer of the LED is that it be transparent to the light from the light-emitting portion. For an AlGaAs layer satisfying that condition to be used as the current diffusion layer, the Al content of the layer has to be higher than a certain value to ensure that the bandgap energy of the AlGaAs current diffusion layer is greater than the bandgap energy of the active layer. However, the higher the Al content, the more prone the AlGaAs is to oxidation. The mixed crystal Al ratio of AlGaAs that is transparent to light in the visible spectrum emitted by an AlGaInP-based LED is in the order of 0.7, around the same as in the composition of cladding layers of an AlGaAs LED fabricated by the LPE method. Therefore, while an AlGaInP LED may emit light at a higher brightness than an AlGaAs LED fabricated by the LPE method and also be superior in humidity resistance, resistance to humidity is still a problem in a structure in which the current diffusion layer is formed of AlGaAs.

In view of the purpose of current diffusion, the thicker the AlGaAs layer, the better. JP-A-4-212479 proposes a thickness of 5 to 30 $\mu$m, while U.S. Pat. No. 5,008,718 proposes a thickness of 2 to 30 $\mu$m, more preferably 5 to 15 $\mu$m (see column 3, line 16, onward). There is also an example of an AlGaAs current diffusion layer 7 $\mu$m thick being used (see Appl. Phys. Lett. Vol. 58 (10), Mar. 11, 1991). Thus, in an LED that uses an AlGaAs current diffusion layer, in order to enhance the current diffusion effect the thickness of the layer is increased, but doing this also increases the Al content, thereby reducing the humidity resistance property by making the AlGaAs more prone to oxidation.

Furthermore, even when provided with such a current diffusion layer to enhance the current diffusion effect, conventional LEDs do not provide sufficient brightness for use outdoors and the like where high brightness is required. Here, brightness is proportional to light emission intensity with the addition of a visibility effect value. Another problem is that increasing the number of the hetero-junction increases device resistance, so a higher operating voltage is required. The reason why high brightness cannot be obtained is considered to be that the double hetero-structure is not lattice matched, in addition to which good-quality epitaxial layer growth is not obtained owing to the fact that the many hetero-junction surfaces are involved. In the case of the four-element mixed crystal $(Al_xGa_{1-x})_yIn_{1-y}P$, lattice matching with the GaAs substrate has always been regarded as being when y is 0.5. However, this is at room temperatures, but with this composition the lattices do not match at epitaxial growth temperatures. Namely, at room temperature a GaAs substrate has a lattice constant of 0.56533 $\mu$m, and at an epitaxial growth temperature of say 780° C. the lattice constant is 0.56804 nm, which is a change of 0.48%. While $(Al_{0.7}Ga_{0.3})_{0.5}In_{0.5}P$ used for the cladding layer has a lattice constant of 0.56640 nm at room temperature, at 780° C. the lattice constant is 0.56837 nm, an increase of 0.348%. Thus, the degree of lattice mismatch between the substrate and the cladding layer is 0.19% at room temperature and 0.058% at 780° C. So, while on first impression epitaxially grown layers of $(Al_xGa_{1-x})_yIn_{1-y}P$ might appear to be lattice-matched, there is quite a degree of mismatch.

The present inventors conducted detailed studies and found that even if lattice matching is achieved at room temperature, it is all the more important to effect lattice matching at the epitaxial growth temperature. Good crystal growth resulting in high brightness is obtained if there is lattice matching during the epitaxial growth process, since even if defects are produced in the crystal lattice after cooling to room temperature, such defects are not of a magnitude enough to reduce the brightness to any real extent.

If good-quality epitaxially grown layers are obtained, current diffusion in the upper cladding layer is also improved, to the extent that even without the provision of a special, thick current diffusion layer, the device resistance can be reduced, which also makes it possible to use a lower operating voltage (the $V_F$ characteristic). Moreover, not having to increase the thickness of the epitaxially grown layers means that the Al concentration is not increased, which resolves the problem of device degradation and therefore results in high device reliability.

An object of the present invention is to provide a high-brightness, long-lasting AlGaInP light-emitting diode having an AlGaAs current diffusion layer that possesses a sufficient current diffusion effect while also maintaining fully adequate humidity resistance, and a wafer used to form the light-emitting diode.

SUMMARY OF THE INVENTION

To attain the above object, the present invention provides an epitaxial wafer for an AlGaInP light-emitting diode, comprising a p-type GaAs substrate, a reflection layer comprised of a lamination of multiple semiconductor layers provided over the substrate, a double hetero-junction light-emitting structure of AlGaInP provided over the reflection layer, the light-emitting structure being comprised of an active layer between upper and lower cladding layers, and a current diffusion layer of AlGaAs provided over the double hetero-junction light-emitting structure, the current diffusion layer being transparent to light emitted by the light-emitting structure, the AlGaAs current diffusion layer being of n-type conductivity, having a carrier concentration of not less than $10^{17}$ cm$^{-3}$ and not more than $2\times10^{19}$ cm$^{-3}$ and having a thickness of not more than 1 μm.

The above object is also attained by an AlGaInP light-emitting diode comprising a p-type GaAs substrate, a reflection layer comprised of a lamination of multiple semiconductor layers provided on the substrate, a double hetero-junction light-emitting structure of AlGaInP provided on the reflection layer, the light-emitting structure being comprised of an active layer between upper and lower cladding layers, a current diffusion layer of AlGaAs provided over the double hetero-junction light-emitting structure, the current diffusion layer being transparent to light emitted by the light-emitting structure, a first electrode provided on a back surface of the GaAs substrate, and a second electrode provided over an upper surface of the current diffusion layer, the AlGaAs current diffusion layer being of n-type conductivity, having a carrier concentration of not less than $10^{17}$ cm$^{-3}$ and not more than $2\times10^{19}$ cm$^{-3}$ and having a thickness of not more than 1 μm.

As described above, in accordance with the present invention a reflection layer is formed over a p-type GaAs single crystal substrate, a double hetero-junction light-emitting structure is formed over the reflection layer, and an n-type current diffusion layer is formed over the double hetero-junction light-emitting structure. The current diffusion layer has a high carrier mobility and a carrier concentration of from $10^{17}$ cm$^{-3}$ to $2\times10^{19}$ cm$^{-3}$, so increase in relative resistance is suppressed, making it possible to obtain a sufficient current diffusion effect even if the thickness of the diffusion layer is not more than 1 μm, in addition to which it enables the Al content to be reduced, resulting in an LED with superior resistance to humidity.

Moreover, by lattice matching each of the layers of the double hetero-junction light-emitting structure to the substrate at epitaxial growth temperatures, good quality crystal is grown, device resistance is reduced, so a lower operating voltage can be used, resulting in an LED that is more reliable and lasts longer.

The resistance of the LED to humidity and oxidation can be further enhanced by forming on the thin film of the AlGaAs current diffusion layer a layer of AlGaInP or GaP that does not readily oxidize.

Further features of the invention, its nature and various advantages will be more apparent from the accompanying drawings and following detailed description of the invention.

DESCRIPTION OF THE PREFERRED EMBODIMENT

If the compositions are the same, n-type semiconductor normally has a lower relative resistance than p-type, owing to the fact that the electrons that form the carriers of n-type semiconductor have a greater mobility than the holes that form the carriers of p-type semiconductor. Based on data on page 151 of "Advanced Electronics I-1/Group III–V Compound Semiconductors" (1994), published by Baifukan, the ratio of n-type to p-type carrier mobility is 20 in the case of GaAs, 43 in the case of InP, and 1.6 in the case of GaP. However, this carrier mobility ratio can vary greatly depending on the perfection of the crystal, the concentration of impurities, and so forth, so in some cases there is small ratio differential such as that listed with respect to GaP.

It is also known that variation may arise depending on the crystal growth method used, presumably owing to differences in crystalline perfection among growth methods. The present inventors measured the Hall effect of a layer grown on a semi-insulator GaAs substrate using MOCVD. With an AlGaAs composition (with an Al mixed crystal ratio of 0.7) transparent to the emitted light of an AlGaInP LED and an impurity concentration in the order of $10^{18}$ cm$^{-3}$, a n-type to p-type mobility ratio of 10.3 was obtained. It follows that if n-type AlGaAs is used to form the current diffusion layer, the current diffusion effect obtained can be expected to be greater than that obtained using the conventional p-type AlGaAs. The inventors attained the present invention largely by applying this fact.

Figure 1:
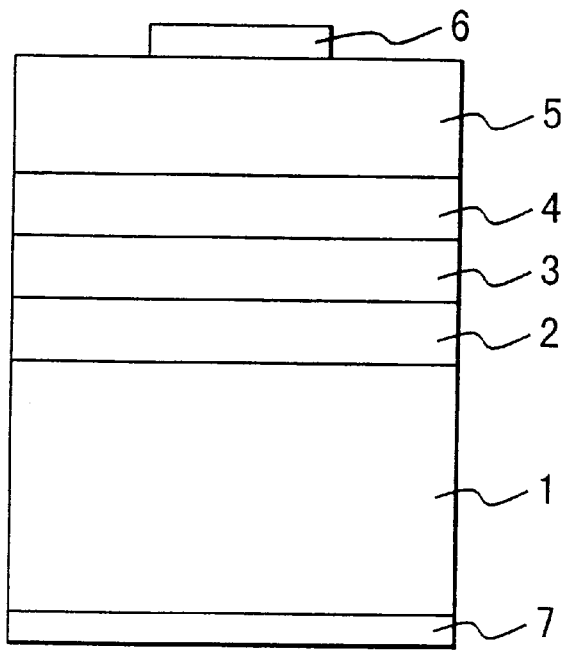
FIG. 1 is a cross-sectional view of the structure of a conventional LED provided with a thick current diffusion layer of AlGaAs.
Figure 2:
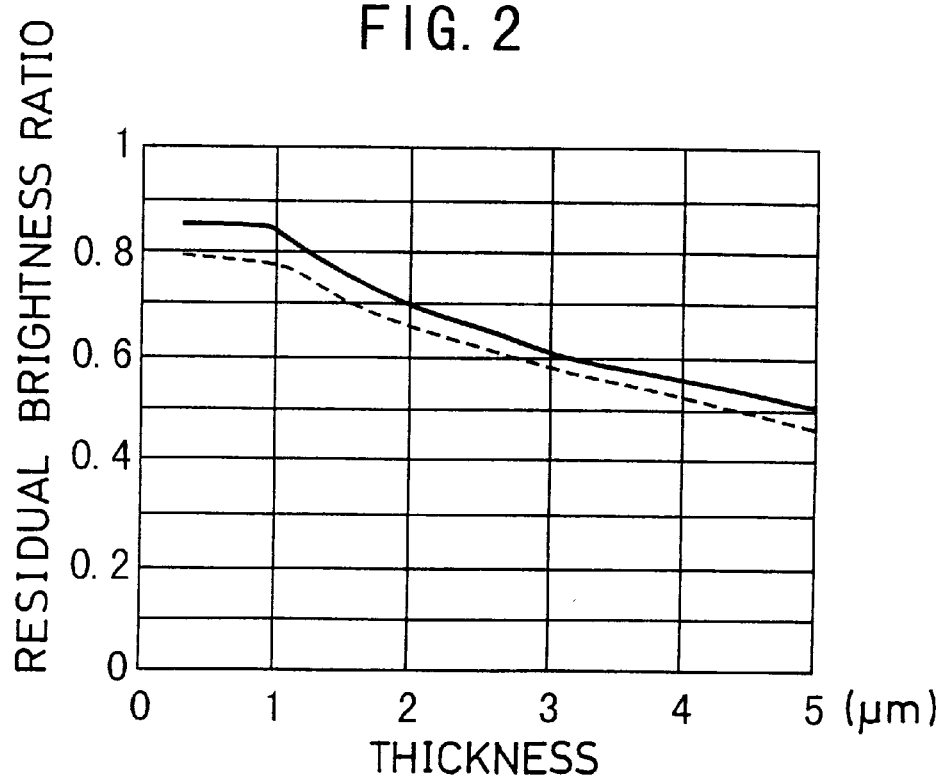
FIG. 2 is a graph showing the relationship between thickness of the AlGaAs current diffusion layer and residual brightness ratio.

FIG. 2 shows the result of an investigation into the relationship between the thickness and of an n-type AlGaAs current diffusion layer of an AlGaInP LED and the brightness degradation of the LED, with the horizontal axis representing the thickness of the n-type AlGaAs layer and the vertical axis representing residual brightness ratio. Measurement conditions were a forward current of 10 mA, temperature of 85° C., humidity of 85%. The residual brightness ratio was obtained applying current for 1,000 hours, and obtaining the difference between the brightness before and after. The broken line indicates when only an AlGaAs current diffusion layer was used, while the solid line indicates when an AlGaInP layer 0.3 μm thick was formed on the AlGaAs current diffusion layer.

From the graph of FIG. 2, it can be seen that there is a correlation between the thickness of the AlGaAs current diffusion layer and residual brightness ratio; when the thickness of the current diffusion layer exceeds 1 μm, the residual brightness ratio markedly decreases. This tendency remains the same when the protective layer of AlGaInP is formed on the n-type AlGaAs layer. However, for the same thickness of the AlGaAs current diffusion layer, the residual brightness ratio is higher with the presence of the AlGaInP protective layer. These two tendencies remain the same when a GaP protective layer is used on the AlGaAs current diffusion layer. Thus, it is preferable that the thickness of the AlGaAs current diffusion layer does not exceed 1 μm.

If the impurity concentration in the n-type AlGaAs current diffusion layer is less than $10^{17}$ cm$^{-3}$, the relative resistance is increased and the layer does not exhibit a sufficient current diffusion effect. On the other hand, if the concentration exceeds $5\times10^{19}$ cm$^{-3}$, light becomes absorbed. Hence the stated range is appropriate, and more preferably is from $5\times10^{17}$ cm$^{-3}$ to $5\times10^{18}$ cm$^{-3}$. An Al mixed crystal ratio should be selected for the AlGaAs that ensures a bandgap energy greater than that of the active layer, and therefore transparency to the emitted light. For example, using an Al mixed crystal ratio of 0.6 or more for the AlGaAs current diffusion layer enables transparency to be maintained with respect to an emission wavelength of 630 nm.

The DH structure around the AlGaInP active layer that is the light-emission core will now be described. The light-emission wavelength is largely determined by the Al mixed crystal ratio. An emission wavelength of 590 to 630 nm is provided by an Al mixed crystal ratio of around 0.30 to 0.12, in which case the bandgap energy Eg will be around 2.1 to 1.97 (eV). The In content has a major bearing on the lattice constant. Therefore, because when a GaAs substrate having a (100) crystal orientation is used the lattice constant of the epitaxial layer can approach the lattice constant of the substrate, it is necessary for the DH structure portion to be given an In mixed crystal ratio in the order of 0.5.

A DH structure is used in which the active layer is sandwiched between upper and lower cladding layers. The cladding layers have a higher bandgap energy than the active layer, so electrons injected into the active layer are confined, increasing opportunities for recombination to take place, and since transparency to the emitted light is also maintained, the effect is that external output efficiency is raised. The bandgap energy of the cladding layers having this function is made higher than the bandgap energy of the active layer by at least 0.1 eV to achieve the injected electron confinement effect. When an Al mixed crystal ratio of 0.30 to 0.12 is used for the active layer, it is effective to provide the cladding layers with an Al mixed crystal ratio of 0.55 to not less than 0.30. The bandgap energy Eg in this case will be around 2.25 to 2.10 eV.

The cladding layer nearer the substrate, that is, the lower cladding layer, is given p-type conductivity and the upper cladding layer is given n-type conductivity. Each cladding layer has a carrier concentration of from $1\times10^{16}$ cm$^{-3}$ to $2\times10^{18}$ cm$^{-3}$.

The lattice matching of the double hetero-junction light-emitting structure portion, the most important element of the invention, will be explained first.

The properties of the GaAs crystal that forms the substrate are widely known, but the properties of the $(Al_xGa_{1-x})_yIn_{1-y}P$ 4-element mixed crystal used to form the double heterojunction have not been clarified. Since AlGaInP is a mixture of AlP, GaP and InP, the properties of the 4-element mixed crystal can be established from the properties of those constituents. The known properties of the crystals are listed in Table 1.

TABLE 1

| Crystal | Lattice constant at room temperature (nm) | Linear expansion coefficient at 0 to 700 K ($\times 10^{-6}$/K) |
|---|---|---|
| AlP | 0.54625 | 4.20 |
| GaP | 0.54512 | 5.91 |
| InP | 0.58688 | 4.56 |
| GaAs | 0.56533 | 6.40 |

These data can be used as a basis to calculate the lattice constant and linear expansion coefficient of the $(Al_xGa_{1-x})_yIn_{1-y}P$ 4-element mixed crystal.

By transforming the composition formula of $(Al_xGa_{1-x})_yIn_{1-y}P$, we get $$(Al_xGa_{1-x})_yIn_{1-y}P = Al_{xy}Ga_{(1-x)y}In_{(1-y)}P \qquad (1)$$

Since the mixed crystal will include xy, (1-x)y, and (1-y) of AlP, GaP, and InP, respectively, so the lattice constant at room temperature $a_{room}$ for each crystal is found by calculating the weighted mean of the lattice constant of each crystal, as shown by equation (2).

$$a_{room} = 0.54625xy + 0.54512(1-x)y + 0.58688(1-y)\,[nm] \qquad (2)$$

And, the linear expansion coefficient $\beta_{epi}$ is obtained by calculating the weighted mean linear expansion coefficient of each, as in equation (3).

$$\beta_{epi} = 4.20xy + 5.91(1-x)y + 4.56(1-y)\,[\times 10^{-6}/K] \qquad (3)$$

Thus, once the mixed crystal ratios x and y have been decided, the room temperature lattice constant $a_{room}$ and linear expansion coefficient $\beta_{epi}$ at 0 to 700 K of the $(Al_xGa_{1-x})_yIn_{1-y}P$ 4-element mixed crystal can be calculated.

Next, if T°C. is the epitaxial growth temperature and $\Delta T$ the temperature differential between growth temperature and room temperature, the lattice constant $a_T$ of the 4-element mixed crystal and the substrate lattice constant $s_T$ at the epitaxial growth temperature will be $$a_T = a_{room}(1 + \beta_{epi} \cdot \Delta T) \qquad (4)$$

$$s_T = s_{room}(1 + \beta_{sub} \cdot \Delta T) \qquad (5)$$

Here, $\beta_{epi}$ is the linear expansion coefficient of the epitaxially grown layer obtained from equation (3) and $\beta_{sub}$ is the linear expansion coefficient of the substrate (for example, GaAs).

Using equations (2) through (5) makes it possible to calculate the lattice constant $a_T$ at epitaxial growth temperature T°C. for a 4-element mixed crystal having mixed crystal ratios x and y. Once lattice constant $a_T$ at T°C. has been established, the degree of lattice mismatch $\Delta a$ at T°C. can be calculated.

If at a given temperature the substrate lattice constant is "s" and the lattice constant of the 4-element mixed crystal is "a", lattice mismatch "$\Delta a$" is defined by equation (6).

$$\Delta a = (s - a)/s \times 100\,(\%) \qquad (6)$$

If the substrate is GaAs crystal and the epitaxial growth temperature for the $(Al_xGa_{1-x})_yIn_{1-y}P$ 4-element mixed crystal is 780° C., lattice mismatch $\Delta a_{room}$ and $\Delta a_{epi}$ for the known 4-element mixed crystal at room temperature and epitaxial growth temperature will be as shown in Table 2.

TABLE 2

| Crystal composition | Room temperature | | 780° C. | |
|---|---|---|---|---|
| | Lattice constant (nm) | Lattice mismatch (%) | Lattice constant (nm) | Lattice mismatch (%) |
| GaAs | 0.56533 | — | 0.56804 | — |
| $(Al_{0.7}Ga_{0.3})_{0.5}In_{0.5}P$ | 0.56640 | 0.190 | 0.56837 | 0.058 |
| $(Al_{0.2}Ga_{0.3})_{0.5}In_{0.5}P$ | 0.56612 | 0.140 | 0.56826 | 0.039 |
| $Al_{0.5}In_{0.5}P$ | 0.56601 | 0.120 | 0.56843 | 0.069 |
| $Ga_{0.5}In_{0.5}P$ | 0.56545 | 0.022 | 0.56822 | 0.032 |

From Table 2, it can be seen that the known AlGaInP 4-element mixed crystal has a lattice mismatch of 0.14 to 0.19% at room temperature, and at epitaxial growth temperature has a lattice mismatch of 0.039 to 0.058%. Using for example $Al_{0.5}Ga_{0.5}P$ or $Ga_{0.5}In_{0.5}P$ as the current diffusion layer would further increase the lattice mismatch.

Thus, an LED formed of the known 4-element mixed crystal of AlGaInP which makes extensive use of heterojunction crystal surfaces having a major lattice mismatch at epitaxial growth temperatures exhibits a large hetero spike, which might be the reason why high brightness is not attained. The utmost effort has to be made to avoid lattice mismatching at epitaxial growth temperatures.

The method of matching lattices at epitaxial growth temperatures will now be explained.

The bandgap energy of a 4-element mixed crystal of AlGaInP is determined by Al ratio in the mixed crystal. The mixed crystal ratio can be adjusted to impart the desired bandgap energy, using measurement of emitted light wavelength based on the photoluminescence (PL) of the prepared crystal. Table 3 shows the bandgap energy $E_g$ and the Al ratio x of the active layer for a target wavelength, with respect to a GaAs (100) substrate.

TABLE 3

| Target wavelength (nm) | Al ratio x and bandgap energy $E_g$ of active layer | | Al ratio x and bandgap energy $E_g$ of cladding layer | |
|---|---|---|---|---|
| | x | $E_g$ | x | $E_g$ |
| 650 | 0.00 | 1.89 | ≧0.7 | ≧2.28 |
| 630 | 0.15 | 1.97 | " | " |
| 620 | 0.17 | 2.00 | " | " |
| 600 | 0.34 | 2.06 | " | " |
| 590 | 0.48 | 2.10 | 1.0 | 2.35 |
| 570 | 0.58 | 2.18 | " | " |

The above data is used to select an Al ratio x in the active layer of mixed crystal that will provide the target emission wavelength. The bandgap energy of the AlGaInP 4-element mixed crystal increases with the increase in the Al ratio x in the mixed crystal, and at a ratio x of more than 0.7 enters the indirect transition region, so the upper limit for Al ratio x in the mixed crystal is set at 0.7. With a ratio x in the mixed crystal being zero the mixed crystal becomes GaInP having an emission wavelength of 650 nm (red). With a ratio x of 0.7, emission wavelength is 550 nm (green).

The bandgap energy of the cladding layers has to be greater than that of the active layer. If the bandgap energy of the cladding layer is lower than that of the active layer, carrier bandgap transition will cause it to act as an absorbent body, with respect to the emitted light. When the carrier confinement effect of the cladding layers is considered, assuming that the LED will be used at room temperature, the bandgap energy of the cladding layers has to be at least 0.1 eV more than the bandgap energy of the active layer. Table 3 also lists the bandgap energies of cladding layers selected accordingly.

The lattice constant is determined by the In content. The mixed crystal In ratio (1-y) is set by the following procedure.

In general, the room-temperature crystal lattice constant of an epitaxially grown layer that is at least 0.1 μm thick can be precisely measured by the double crystal x-ray diffraction method or the like. Accordingly, the lattice constants of epitaxially grown crystals containing various Al ratios x and In ratios y are measured, and in accordance with equation (4), these values are then used to calculate the lattice constant at the epitaxial growth temperature (T°C.). Equation (6) can then be used to obtain the degree of lattice mismatch at T°C. These values should be used to select x and y exhibiting a lattice mismatch of zero (i.e., perfect lattice matching) at the epitaxial growth temperature. In this way, the In ratio (1-y) in the mixed crystal is adjusted to obtain a specified lattice mismatch at room temperature. Specifically, in accordance with equations (4) and (5), lattice matching conditions at the epitaxial growth temperature are $$a_T - s_T = a_{room}(1+\beta_{epi} \cdot \Delta T) - s_{room}(1+\beta_{sub} \cdot \Delta T) = 0 \qquad (7)$$

In equation (7) the right-hand term is growth temperature, which will be known once $\Delta T$ is set. $a_{room}$ and $s_{room}$ are provided by equations (4) and (5), respectively, and are both functions of x and y. However, since x is also constrained by the target bandgap energy, with respect to y, equation (7) becomes a quadratic equation. With respect to y, a solution is sought that satisfies the condition $0 < y \leq 1$, room-temperature lattice constant $a_{room}$ is obtained by again substituting x and y in equation (2), and the lattice mismatch at room temperature is then obtained. Table 4 shows the degree of room-temperature lattice mismatching in AlGaInP 4-element mixed crystal which has been rigorously lattice matched at an epitaxial growth temperature of 780° C., in accordance with this procedure.

In Table 4, when the Al ratio x in the mixed-crystal of AlGaInP is changed from 0.0 (GaInP) to 1.0 (AlInP), the lattice mismatch between the substrate and the active layer at room temperature is changed from 0.085% to 0.15%. This means that if the lattice mismatch at room temperature falls within this range, it is considered that the substrate and the active layer at the epitaxial growth temperature are lattice-matched.

TABLE 4

| 780° C. | | Room temperature | | Mixed crystal ratio | | Crystal composition |
|---|---|---|---|---|---|---|
| Mismatch (%) | Lattice constant (nm) | Mismatch (%) | Lattice constant (nm) | x | 1 − y | $(Al_xGa_{1-x})_yIn_{1-y}P$ |
| 0.00 | 0.56804 | 0.085 | 0.56581 | 0.0000 | 0.5045 | $Ga_{0.4955}In_{0.5045}P$ |
| 0.00 | " | 0.095 | 0.56587 | 0.1700 | 0.5054 | $(Al_{0.1700}Ga_{0.8300})_{0.4946}In_{0.5054}P$ |
| 0.00 | " | 0.115 | 0.56598 | 0.4800 | 0.5069 | $(Al_{0.4800}Ga_{0.5200})_{0.4931}In_{0.5069}P$ |
| 0.00 | " | 0.122 | 0.56602 | 0.5800 | 0.5074 | $(Al_{0.5800}Ga_{0.4200})_{0.4926}In_{0.5074}P$ |
| 0.00 | " | 0.130 | 0.56606 | 0.7000 | 0.5080 | $(Al_{0.7000}Ga_{0.3000})_{0.4920}In_{0.5080}P$ |
| 0.00 | " | 0.150 | 0.56618 | 1.0000 | 0.5095 | $Al_{0.4905}In_{0.5095}P$ |

Fabricating a double hetero-junction light-emitting structure using $(Al_xGa_{1-x})_yIn_{1-y}P$ 4-element mixed crystal having the mixed crystal ratios x and y shown in Table 4 enables epitaxially grown crystal to be obtained that exhibits a good lattice match with a GaAs substrate at the epitaxial growth temperature, thereby providing an LED with high brightness and high reliability.

Table 4 is based on an epitaxial growth temperature of 780° C. However, even if the epitaxial growth temperature is changed, the same procedure can be used to select a 4-element mixed crystal composition that exhibits lattice matching at the epitaxial growth temperature.

An epitaxial growth temperature of 730 to 830° C. is appropriate for obtaining good quality 4-element mixed crystal. There will be slight lattice mismatching within this temperature range, but within permissible limits. Consequently, the range of the In ratio (1-y) in the mixed crystal is set at $0.5045 \leq (1-y) \leq 0.5095$.

In accordance with this invention, an n-type AlGaInP or n-type GaP protective layer may also be provided on the n-type AlGaAs current diffusion layer. This is to improve humidity resistance by covering the surface of the LED that would come into contact with the air with a crystal layer having a low Al content, or a crystal layer containing no Al that is stable with respect to moisture in the air. The bandgap of the GaP is 2.34 eV, and the bandgap of the AlGaInP having an Al ratio of 0.35 is 2.28 eV, so each is transparent to the emitted light. The current diffusion effect will not be hindered provided the carrier concentration is from not less than $1 \times 10^{17}$ cm$^{-3}$ to not more than $1 \times 10^{19}$ cm$^{-3}$. A thickness of up to 0.5 μm is enough to prevent oxidation. The combined thickness of the protective layer and the current diffusion layer is set at not more than 1 μm.

In the case of this invention, a reflection layer comprised of multiple epitaxial layers can be used to provide a further improvement in brightness. The reflection layer may be what is termed a DBR layer comprised of alternations of epitaxial layers having mutually different refractive indexes. To obtain high reflectance, a composition should be chosen that has low light absorption in the target wavelengths and as large as possible a refractive index differential. Ten to 25 sets of these layers are used to form a thickness that is ¼ the target emission wavelength (if n is the refractive index of the layer concerned and λ the target emission wavelength, the layer thickness will be λ/4n). Using for example 25 layers of AlGaAs having an Al composition of 0.4 and a thickness of 41.9 nm alternated with 25 layers of AlGaAs having an Al composition of 0.95 and a thickness of 49.3 nm will provide reflection of over 90% of light having a wavelength of 600 to 640 nm.

A contact layer is formed on the current diffusion layer/protective layer, and an n-type ohmic electrode is formed on the contact layer. To complete the LED, a p-type ohmic electrode is formed on the back surface of the GaAs substrate. The yardstick in choosing a material for the contact layer should be to use a material that is able to readily form an ohmic connection with the metal electrode provided on the contact layer. GaAs is an ideal material for the structure of this invention, and 0.1 to 1 μm is a suitable thickness. A carrier concentration of not less than $1 \times 10^{18}$ cm$^{-3}$ is required. Au/Au—Ge can be used for n-type electrodes and Au/Au—Be for p-type electrodes. An LED wafer thus fabricated provides sufficient diffusion of current injected from the top electrode, resulting in an LED with high output, meaning high brightness.

The LED derived from this invention is given high brightness as well as good weather resistance by reducing the thickness of oxidation-prone Al-rich layers, which improves resistance to humidity, and employing instead a current diffusion layer of n-type AlGaAs having high mobility, ensuring an adequate current diffusion effect. Furthermore, by lattice-matching the light-emission structure portion at a high temperature, the quality of the epitaxially grown crystal is improved, enabling even higher brightness to be attained.

Examples of the present invention are described below. Examples 1 to 3 use an n-type AlGaAs current diffusion layer, and in addition to this n-type AlGaAs current diffusion layer, in the case of Examples 4 to 6 lattice-matching of the substrate and light-emission structure is effected at epitaxial growth temperatures.

EXAMPLE 1

Figure 3:
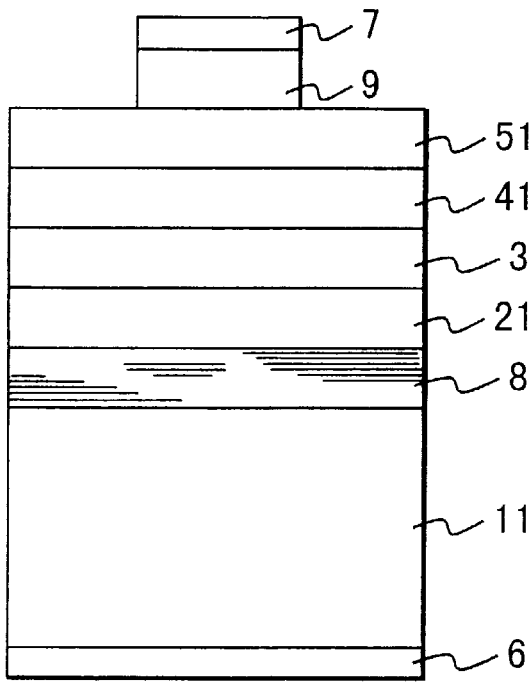
FIG. 3 is a cross-sectional view of an LED pertaining to first and fourth embodiments of the invention.

An LED having the cross-sectional structure shown in FIG. 3 was fabricated. Specifically, a substrate 11 was formed using Zn-doped p-type GaAs single-crystal having a carrier concentration of $2 \times 10^{18}$ cm$^{-3}$ and a crystal plane orientation of (100). On the substrate 11, a Zn-doped reflection layer 8 was formed comprised of 25 layers of $Al_{0.4}Ga_{0.6}As$ each having a thickness of 41.9 nm alternated with 25 layers of $Al_{0.95}Ga_{0.05}As$ each having a thickness of 49.3 nm. A laminated DH structure of AlGaInP comprised of an active layer 3 composed of $(Al_{0.2}Ga_{0.8})_{0.5}In_{0.5}P$ sandwiched between upper and lower cladding layers 41 and 21 composed of $(Al_{0.35}Ga_{0.65})_{0.5}In_{0.5}P$ was formed on the reflection layer 8. An n-type AlGaAs current diffusion layer 51 having an Al ratio of 0.7, a thickness of 0.5 μm and a carrier concentration of $1.5 \times 10^{18}$ cm$^{-3}$ was then formed on the DH structure. Next, an n-type GaAs contact layer 9 was formed on the current diffusion layer 51, and electrodes 6 and 7 were then formed by photolithography and etching and alloying techniques, resulting in the LED of FIG. 3. The MOVCD method was used to grow all the layers. Resistance to humidity was evaluated by applying a forward current of 10 mA for 1,000 hours at a temperature of 85° C. and a humidity of 85%, and comparing the brightness before and after the 1,000 hours. The properties of the LED obtained from the measurement results are listed in Table 5. These show good resistance to humidity, with brightness decreasing only some 20%.

TABLE 5

|  | Example 1 | Example 2 | Example 3 | Example 4 | Example 5 | Example 6 | Comparative |
|---|---|---|---|---|---|---|---|
| Protective layer | None | n-AlGaInP 0.5 μm | n-GaP 0.5 μm | None | n-AlGaInP 0.5 μm | n-GaP 0.5 μm | None |
| Current diffusion layer | n-AlGaAs 0.5 μm | n-AlGaAs 0.5 μm | n-AlGaAs 0.5 μm | n-AlGaAs 0.5 μm | n-AlGaAs 0.5 μm | n-AlGaAs 0.5 μm | p-AlGaAs 5 μm |
| With reflection layer? | Yes | Yes | Yes | Yes | Yes | Yes | Yes |

TABLE 5-continued

|  | Example 1 | Example 2 | Example 3 | Example 4 | Example 5 | Example 6 | Comparative |
|---|---|---|---|---|---|---|---|
| Substrate | p-GaAs | p-GaAs | p-GaAs | p-GaAs | p-GaAs | p-GaAs | n-GaAs |
| Lattice matching temperature | Room | Room | Room | 780° C. | 780° C. | 780° C. | Room |
| Emission wavelength (nm) | 620 | 620 | 620 | 620 | 620 | 620 | 620 |
| Initial brightness (mcd) (I: 20 mA) | 43 | 45 | 44 | 51 | 50 | 53 | 46 |
| Forward voltage (V) (I: 20 mA) | 1.85 | 1.9 | 1.9 | 1.83 | 1.87 | 1.9 | 1.84 |
| Brightness after test (mcd) (I: 20 mA) | 34 | 38 | 37 | 40 | 42 | 44 | 20 |
| Residual brightness (%) | 79 | 84 | 85 | 78 | 84 | 83 | 43 |

EXAMPLE 2

As in Example 1, a DH structure was formed on a reflection layer 8 on a substrate 11, an n-type AlGaAs current diffusion layer 51 was formed on the DH structure of an active layer 3 sandwiched between upper and lower cladding layers 41 and 21. Then, an Se-doped n-type AlGaInP protective layer 101 that was 0.5 μm thick was formed on the current diffusion layer 51. The protective layer 101 had an Al ratio of 0.15 and a carrier concentration of $1\times10^{18}$ cm$^{-3}$.

Figure 4:
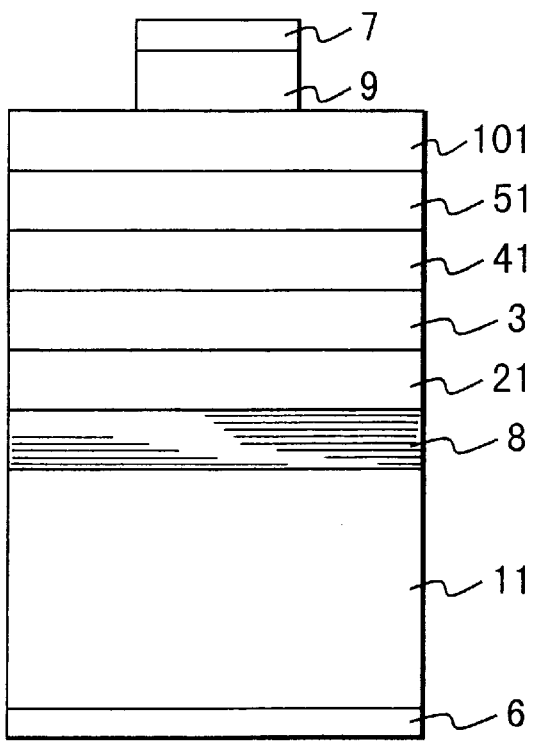
FIG. 4 is a cross-sectional view of an LED pertaining to second and fifth embodiments of the invention.

As in Example 1, an n-type GaAs contact layer 9 was formed, and electrodes 6 and 7 were then formed by photolithography and etching and alloying techniques, to produce an LED having the cross-sectional structure shown in FIG. 4. As shown in Table 5, which lists the result of measurements made as in Example 1, the LED thus fabricated exhibited good properties.

EXAMPLE 3

Figure 5:
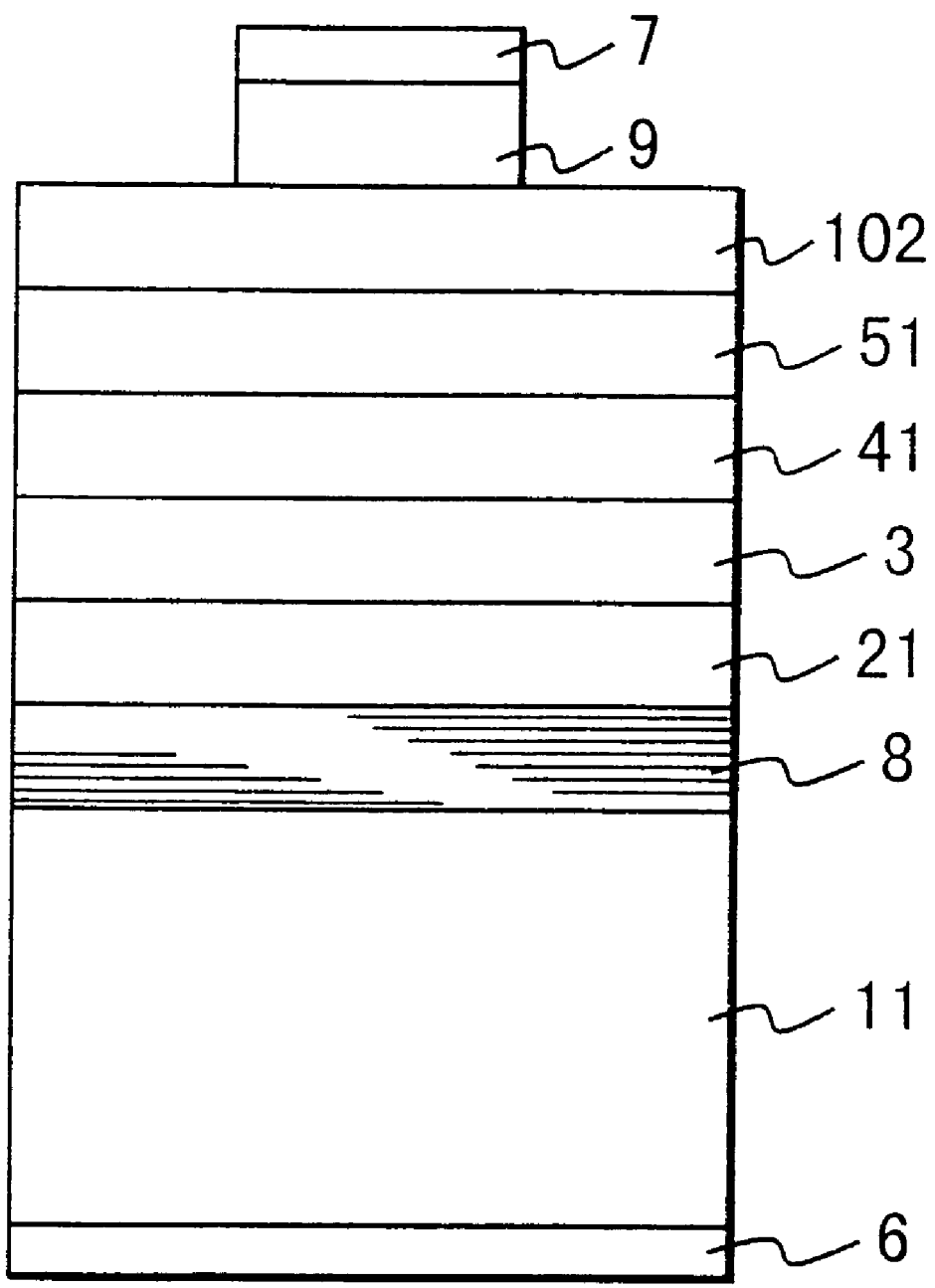
FIG. 5 is a cross-sectional view of an LED pertaining to third and sixth embodiments of the invention.

An LED having the cross-sectional structure shown in FIG. 5 was fabricated. The structure of this LED is identical to that of the LED of Example 2, except that instead of using an n-type AlGaInP protective layer, the LED of Example 3 uses a protective layer 102 of Se-doped n-type GaP. The evaluation results listed in Table 5 show that this LED also has good properties.

EXAMPLE 4

In the case of Examples 1 to 3, the compositions of the layers of the light-emitting double hetero-structure were adjusted for matching the lattice of the layers to the substrate at room temperature, and the layers were then grown using an epitaxial growth temperature of 780° C. In the case of this Example 4, however, this lattice matching was effected at the epitaxial growth temperature. Specifically, the double hetero-structure portion was epitaxially grown as follows.

To obtain a light-emission wavelength of 620 nm, the bandgap energy $E_g$ of the active layer 3 was set at 2.00 eV. Also, to ensure the carrier containment effect of lower cladding layer 21 and upper cladding layer 41 and transparency to the emitted light, the bandgap energy $E_g$ of the cladding layers was set at 2.29 eV, 0.29 eV higher than that of the active layer 3. As a result, the Al ratio x was approximately 0.17 in the case of the active layer 3, approximately 0.7 in the case of the lower cladding layer 21 and approximately 0.7 in the case of the upper cladding layer 41.

The temperature for epitaxial growth of the double hetero-junction light-emitting portion was set at 780° C., and the lattice constants were perfectly matched to the GaAs substrate at that growth temperature. That is, the lattice constant of GaAs at 780° C. is 5.6804 Å, so the above equations were used to determine the ratios x and y that would produce a lattice constant of 5.6804 Å in the four-element mixed crystal layers of the double hetero-junction. The ratios x and y that would satisfy the required bandgap energy lattice constant conditions in accordance with the gist of this invention were therefore calculated, resulting in the composition $(Al_{0.1700}Ga_{0.8300})_{0.4946}In_{0.5054}P$ for the active layer 3 and $(Al_{0.7000}Ga_{0.3000})_{0.4920}In_{0.5080}P$ for the upper and lower cladding layers 41 and 21.

The carrier concentration of each of the layers of the resultant double hetero-junction structure was measured, and found to be $1\times10^{17}$ cm$^{-3}$ in the case of the lower cladding layer 21, $1\times10^{16}$ cm$^{-3}$ in the case of the active layer 3 and $3\times10^{17}$ cm$^{-3}$ in the case of the upper cladding layer 41.

The lattice constant of each of the layers of the double hetero-junction structure was measured, and the degree of lattice mismatch obtained in accordance with equation (6). Lattice mismatch Δa was 0.12% with respect to the lower cladding layer 21, 0.09% with respect to the active layer 3 and 0.10% with respect to the upper cladding layer 41, so there was a marked improvement in the lattice matching of each layer, compared to the prior art.

Based on an evaluation of the characteristic properties of the LED thus obtained, the wavelength was found to be 620 nm, the initial brightness at a current of 20 mA was 51 mcd, forward voltage ($V_F$) was 1.83 V, and a test to examine deterioration after 1,000 hours of operation showed a brightness of 40 mcd after the test, for a good residual brightness of 78%. The results are shown in Table 5.

EXAMPLE 5

The LED of this example was obtained by forming an Se-doped n-type AlGaInP layer 0.5 μm thick as in Example 2 on the n-type AlGaAs current diffusion layer obtained in Example 4. The Al mixed crystal ratio was 0.15 and the carrier concentration was $1×10^{18}$ cm$^{-3}$. A contact layer and electrodes were formed to complete the LED in the same manner as in Example 1, and the properties were measured and are listed in Table 5.

EXAMPLE 6

An LED was fabricated having a structure identical to that of the LED of Example 5, except that instead of an n-type AlGaInP protective layer, the LED of this example was given a protective layer of Se-doped n-type GaP. A contact layer and electrodes were formed to complete the LED in the same manner as in Example 1, and the properties were measured and are listed in Table 5.

Comparative Example

For comparison, an LED was fabricated comprising a substrate of Si-doped n-type GaAs single-crystal having a carrier concentration of $1×10^{18}$ cm$^{-3}$ and a crystal plane orientation of (100). On the substrate, a Se-doped reflection layer was formed comprised of 25 layers of $Al_{0.4}Ga_{0.6}As$ each having a thickness of 41.9 nm alternated with 25 layers of $Al_{0.95}Ga_{0.05}As$ each having a thickness of 49.3 nm. A laminated DH structure of AlGaInP comprised of an active layer composed of $(Al_{0.2}Ga_{0.8})_{0.5}In_{0.5}P$ and cladding layers composed of $(Al_{0.35}Ga_{0.65})_{0.5}In_{0.5}P$ was formed on the reflection layer. A p-type AlGaAs layer having an Al mixed crystal ratio of 0.7, a thickness of 5 µm and a carrier concentration of $1.5×10^{18}$ cm$^{-3}$ was then formed on the DH structure, and a p-type GaAs contact layer was formed on that layer, and electrodes were then formed by photolithography and etching and alloying techniques. For reference, the properties of the LED are listed in Table 5.

As is clear from the foregoing description, in accordance with this invention the humidity resistance of an AlGaInP LED can be improved by markedly reducing the thickness of the AlGaAs current diffusion layer to not more than 1 µm.

The effect of the invention is not hampered by the normal provision of epitaxial buffer layers having the same composition as that of the substrate to improve the crystallinity of films grown epitaxially on the semiconductor substrate, nor by the provision of GaAs contact layers and the like to reduce the resistance of ohmic electrode connections.

Also, while the above description was made with reference to a substrate having a crystal orientation that is precisely (100), an offset substrate may be used, that is, a substrate having an inclined orientation relative to the (100) plane, without adversely affecting the effect of the invention in any way.

What is claimed is:

1. An epitaxial wafer for an AlGaInP light-emitting diode, comprising:
   a p-type GaAs substrate,
   a reflection layer comprised of a lamination of multiple semiconductor layers provided over the substrate,
   a double hetero-junction light-emitting structure of AlGaInP provided over the reflection layer, said light-emitting structure being comprised of an active layer between upper and lower cladding layers,
   a current diffusion layer of n-type AlGaAs provided over the double hetero-junction light-emitting structure, said current diffusion layer being transparent to light emitted by the light-emitting structure and having a carrier concentration of not less than $10^{17}$ cm$^{-3}$ and a thickness of not more than 1 µm, and
   a protective layer provided over the current diffusion layer, said protective layer being transparent to light emitted by the light-emitting structure and having a thickness up to 0.5 µm.

2. An epitaxial wafer according to claim 1, wherein the protective layer is formed of AlGaInP.

3. An epitaxial wafer according to claim 1, wherein the protective layer is formed of GaP.

4. An epitaxial wafer according to claim 1, wherein at room temperature lattice mismatch between the layers constituting the double hetero-junction light-emitting structure and the GaAs substrate is from 0.085% to less than 0.140%.

5. An epitaxial wafer according to claim 1, wherein the layers constituting the double hetero-junction light-emitting structure and the GaAs substrate are lattice matched at epitaxial growth temperature.

6. An AlGaInP light-emitting diode, comprising:
   a p-type GaAs substrate,
   a p-type ohmic electrode provided on a back surface of the substrate,
   a reflection layer comprised of a lamination of multiple semiconductor layers provided over the substrate,
   a double-hetero-junction light-emitting structure of AlGaInP provided over the reflection layer, said light-emitting structure being comprised of an active layer between upper and lower cladding layers,
   a current diffusion layer of n-type AlGaAs provided over the double hetero-junction light-emitting structure, said current diffusion layer being transparent to light emitted by the light-emitting structure and having a carrier concentration of not less than $10^{17}$ cm$^{-3}$ and not more than $2×10^{19}$ cm$^{-3}$ and a thickness of not more than 1 µm,
   a protective layer provided over the current diffusion layer, said protective layer being transparent to light emitted by the light-emitting structure and having a thickness up to 0.5 µm, and
   an n-type ohmic electrode provided on the AlGaAs current diffusion layer.

7. A light-emitting diode according to claim 6, wherein the protective layer is formed of AlGaInP.

8. A light-emitting diode according to claim 6, wherein the protective layer is formed of GaP.

9. A light-emitting diode according to claim 6, wherein at room temperature lattice mismatch between the layers constituting the double hetero-junction light-emitting structure and the GaAs substrate is from 0.085% to less than 0.140%.

10. A light-emitting diode according to claim 6, wherein the layers constituting the double hetero-junction light-emitting structure and the GaAs substrate are lattice matched at epitaxial growth temperature.

11. An epitaxial wafer according to claim 1, wherein the current diffusion layer and the protective layer have a total thickness of not more than 1 µm.

12. An epitaxial wafer according to claim 11, wherein the protective layer is formed of AlGaInP.

13. An epitaxial wafer according to claim 11, wherein the protective layer is formed of GaP.

14. An AlGaInP light-emitting diode according to claim 6, wherein the current diffusion layer and the protective layer have a total thickness of not more than 1 µm.

15. An AlGaInP light-emitting diode according to claim 14, wherein the protective layer is formed of AlGaInP.

16. An AlGaInP light-emitting diode according to claim 14, wherein the protective layer is formed of GaP.

* * * * *